United States Patent [19]
Fischer et al.

[11] Patent Number: 5,505,993
[45] Date of Patent: Apr. 9, 1996

[54] APPLICATION OF A THIN METAL LAYER TO A POLYMERIC SUBSTRATE

[75] Inventors: Gerd Fischer, Bockenheim; Hans-Peter Schildberg, Mannheim; Hartmut Hibst, Schriesheim, all of Germany

[73] Assignee: BASF Magnetics GmbH, Mannheim, Germany

[21] Appl. No.: 286,227

[22] Filed: Aug. 5, 1994

Related U.S. Application Data

[63] Continuation-in-part of Ser. No. 107,053, Aug. 17, 1993, abandoned.

[30] Foreign Application Priority Data

Aug. 20, 1992 [DE] Germany .................... 42 27 588.1

[51] Int. Cl.$^6$ .................................................. C23C 14/24
[52] U.S. Cl. ...................... 427/250; 427/124; 427/123; 427/128; 427/132; 427/255.5
[58] Field of Search ........................ 427/250, 124, 427/123, 128, 132, 255.5

[56] References Cited

U.S. PATENT DOCUMENTS

| | | | |
|---|---|---|---|
| 3,342,632 | 9/1967 | Bate et al. | 117/217 |
| 4,323,626 | 4/1982 | Kunimune et al. | 428/374 |
| 4,354,908 | 10/1982 | Shirahata et al. | 204/192 |
| 4,999,220 | 3/1991 | Honda et al. | 427/132 |
| 5,000,995 | 3/1991 | Kishi et al. | 428/64 |
| 5,188,865 | 2/1993 | Richter et al. | 427/128 |
| 5,192,583 | 3/1993 | Richter et al. | 427/128 |
| 5,290,590 | 3/1994 | Richter et al. | 427/128 |

FOREIGN PATENT DOCUMENTS 3204337  11/1982  Germany .

*Primary Examiner*—Roy V. King
*Attorney, Agent, or Firm*—Keil & Weinkauf

[57] ABSTRACT

A thin metal layer is applied in a thickness of less than 1,000 nm to a polymeric, web-like substrate which is moved along a cylindrical support in a vacuum chamber containing an evaporator crucible releasing the metal vapor toward the support and two coating screens arranged between the evaporator crucible and the support and defining the limiting angles of incidence of the vapor jet striking the substrate, by a process in which, in the case of predetermined limiting angles of incidence, the amount of metal vapor applied to the substrate can be optimized by means of the arrangement of the coating screens and the position of the evaporator crucible.

1 Claim, 5 Drawing Sheets

1

APPLICATION OF A THIN METAL LAYER TO A POLYMERIC SUBSTRATE

This application is a continuation-in-part of application Ser. No. 08/107,053, filed on Aug. 17, 1993, now abandoned.

BACKGROUND OF THE INVENTION

The present invention relates to a process for applying a thin metal layer in a thickness of less than 1,000 nm to a polymeric, web-like substrate which is moved along a cylindrical support in a vacuum chamber containing an evaporator crucible releasing the metal vapor toward the support and two coating screens arranged between the evaporator crucible and the support and defining the limiting angles of the vapor jet striking the substrate.

DESCRIPTION OF THE RELATED ART

The application of thin metal layers to polymeric substrates is of interest particularly in the production of magnetic recording media. In comparison with conventional particulate magnetic media, coherent magnetic thin films permit recording at higher storage densities. This is due on the one hand to the small layer thickness of only from 20 to 1,000 nm and the associated low demagnetization effect and on the other hand to the larger number of molecular magnets per unit volume and the higher magnetization. While in the case of the particulate recording media longitudinal recording of the magnetic particles oriented along the running direction of the tape is usual, in the high-density magnetic thin films an oblique orientation of the molecular magnets in the coherent metal layer in accordance with the field lines in front of the head is desirable. By oblique deposition of the ferromagnetic material onto the substrate, substantially improved recording properties can be achieved, as described, inter alia, for Co—Ni—O layers in U.S. Pat. No. 3,342,632 and U.S. Pat. No. 4,323,629 or for Co—Cr layers by R. Sugita et al., Digest Intermag 1990, Paper FA-08. The angular range which is desired in each case and decisively influences the properties of the applied magnetic layer is obtained by suitably arranging screens in the vapor deposition or sputtering of material. In comparison with coating at right angles, however, the sometimes dramatically reduced efficiency of evaporation is a disadvantage in the case of oblique coating (A. Feuerstein et al., IEEE Trans. Mag. 20(1) (1984), 51). It has therefore been proposed, in the case of electron beam evaporation, to collect on a condensate plate some of the vapor incident outside the intended substrate range and to recycle said vapor to the crucible. In another method for increasing the efficiency of evaporation, the vapor jet is ionized and is directed at the substrate film by means of electric fields (DE-C 26 22 597). In a further process, the vapor cloud is guided to the substrate through a chimney having heated walls (DE-A 32 04 337).

SUMMARY OF THE INVENTION

It is the object of the present invention to modify the process for applying thin metal layers to a polymeric substrate by means of a PVD method by oblique deposition of the material so that the efficiency of evaporation can be optimized for a predetermined range of angles of incidence, We have found that this object is achieved by a process for applying a thin metal layer in a thickness of less than 1,000 nm to a polymeric, web shaped substrate which is moved along a cylindrical support in a vacuum chamber containing an evaporator crucible releasing the metal vapor toward the support and two coating screens arranged between the evaporator crucible and the support and defining the limiting angles of the vapor jet striking the substrate, if, in the case of limiting angles of incidence $\alpha_1$ and $\alpha_2$ which are given by the angles between the normals to the support at the edges of the screens and the connecting lines from the center of the crucible to the corresponding edges of the screens, the center of the evaporator crucible is arranged at the point $P(x_T/y_T)$ in the coordinate system for a fixed $y_T$ position, and the positions of the coating screens which leave a region of the substrate limited by the angles $\phi_1$ and $\phi_2$ free for coating, the angles being calculated in the counterclockwise direction starting from the positive x axis of a coordinate system whose origin is on the axis of rotation of the support, are defined by the angles $\alpha_1$ and $\alpha_2$ and the position of the crucible, so that, according to the formula $$A(\phi_1, \phi_2, x_t, y_T) = \int_{\beta_1(\phi_1, x_t, y_T)}^{\beta_2(\phi_2, x_t, y_T)} \cos^n(\beta) d\beta / \int_{-\frac{\pi}{2}}^{\frac{\pi}{2}} \cos^n(\beta) d\beta$$

A has a maximum value at point $x_t = x_T$, where A is the amount of the metal vapor striking the substrate relative to the total evaporated amount, $\beta_1$ and $\beta_2$ are the angles between the normal to the center of the crucible and the connecting lines from the center of the crucible to the edge of the particular screen and n is a number of from 2 to 5. $X_t$ is a free variational parameter representing the general horizontal x-position of the evaporator crucible. $X_T$ is the special value of $X_t$ where the evaporation efficiency A expressed as a function of $X_t$ reaches its maximum value.

$Y_T$ is a fixed value representing the vertical Y-position of the evaporator crucible, which is fixed by and depends on the construction of rollcoating and evaporating equipment.

BRIEF DESCRIPTION OF THE DRAWING

Details, features and advantages of the novel process are described by means of Examples and with reference to the Figures and the embodiments.

DESCRIPTION OF THE PREFERRED EMBODIMENTS

Figure 1:
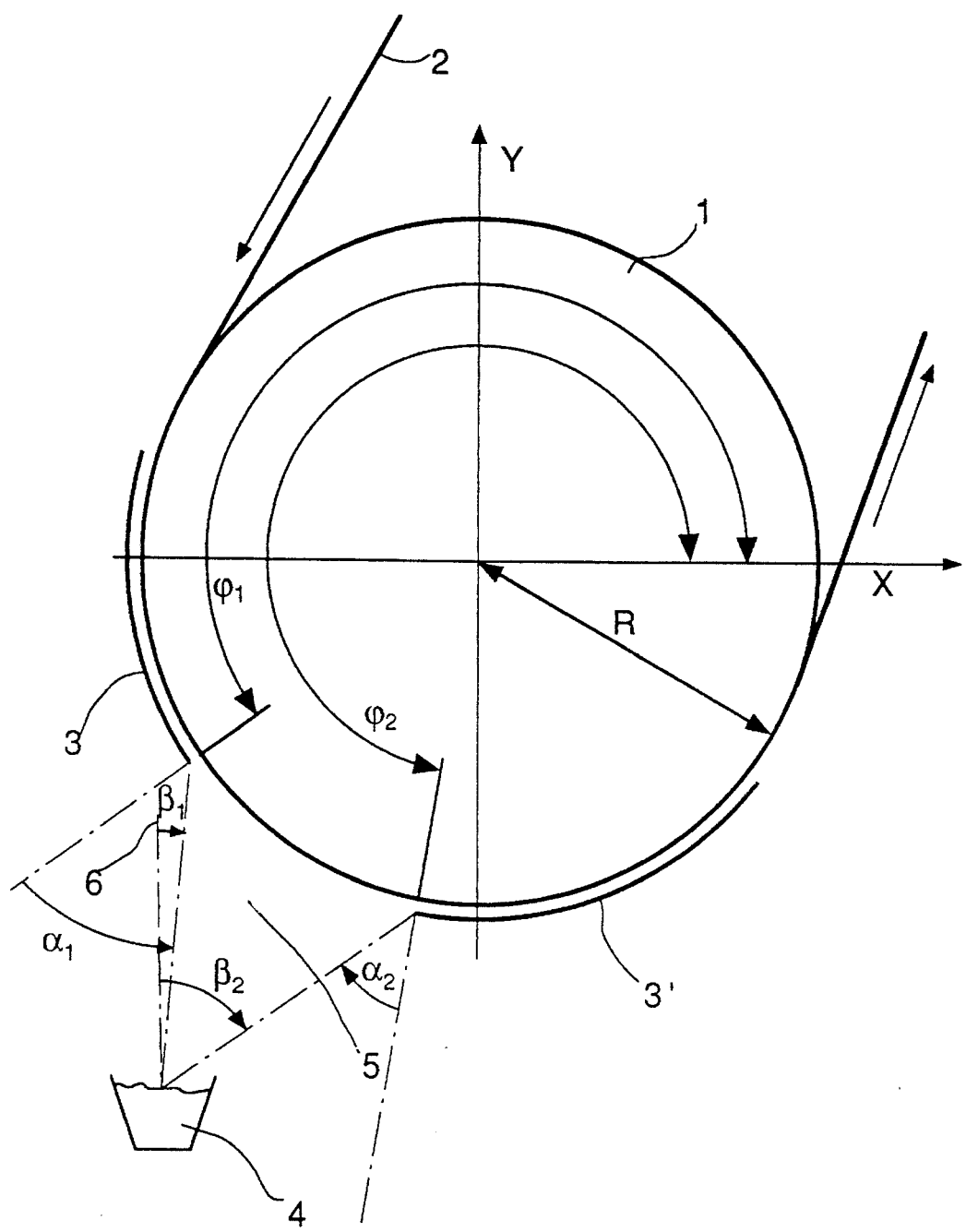
FIG. 1 shows a geometry in the oblique incidence method for coating substrates and FIGS. 2(A), 2(B), 2(C), 3(A), 3(B), and 3(C) show efficiencies of evaporation according to the Examples as a function of the position of the evaporator crucible and the position of the screens for predetermined limiting angles of incidence.

The vapor deposition station shown schematically in FIG. 1 is used to illustrate the novel process. Here, the web-like substrate 2 is passed over the cylindrical support 1 which has a radius R and whose axis of rotation passes through the origin of the x/y coordinate system. By means of the coating screens 3 and 3', the range 5 is selected from the (metal) vapor jet emanating from the evaporator crucible 4, for condensation on the substrate. The angular range on the substrate 2, which range is left free for vapor deposition, is defined by the angles $\phi_1$ and $\phi_2$, the range of angles of incidence is defined by the angles $\alpha_1$ and $\alpha_2$ and the position of the evaporator crucible is defined by the coordinates $x_t$ and $y_t$. In the positioning of the crucible, the $y_t$ position is generally fixed ($y_t = y_T$). Assuming a linear crucible, the following relationships are obtained from the geometric arrangement for the coating angles $\beta_1$ and $\beta_2$ (based on the normal 6 to the center of the crucible):

$$\beta_1(\phi_1, x_t, y_T) = \arctan\left[\left(\frac{x_t}{R} - \cos\phi_1\right) / \left(\frac{y_T}{R} - \sin\phi_1\right)\right] \quad \text{(I)}$$

$$\beta_2(\phi_2, x_t, y_T) = \arctan\left[\left(\frac{x_t}{R} - \cos\phi_2\right) / \left(\frac{y_T}{R} - \sin\phi_2\right)\right] \quad \text{(II)}$$

With the predetermining limiting angles of incidence $\alpha_1$ and $\alpha_2$ and with the particular chosen position $x_t$ for a fixed position $y_T$ of the crucible, the angles $\phi_1$ and $\phi_2$ are obtained as solutions of the implicit equations $$\phi_1(\alpha_1, x_t) = 270° - \arctan\left[\left(\frac{x_t}{R} - \cos\phi_1(\alpha_1, x_t)\right) / \left(\frac{y_T}{R} - \sin\phi_1(\alpha_1, x_t)\right)\right] - \alpha_1 \quad \text{(III)}$$

and $$\phi_2(\alpha_2, x_t) = 270° - \arctan\left[\left(\frac{x_t}{R} - \cos\phi_2(\alpha_2, x_t)\right) / \left(\frac{y_T}{R} - \sin\phi_2(\alpha_2, x_t)\right)\right] - \alpha_2 \quad \text{(IV)}$$

With the aid of these formulae (I), (II), (III) and (IV), the following mathematical expression is obtained for the relative efficiency of evaporation A which remains in the substrate range defined by the angles $\beta_1$ and $\beta_2$ $$A(\phi_1, \phi_2, x_t, y_T) = \int_{\beta_1(\phi_1, x_t, y_T)}^{\beta_2(\phi_2, x_t, y_T)} \cos^n(\beta) d\beta / \int_{-\frac{\pi}{2}}^{\frac{\pi}{2}} \cos^n(\beta) d\beta \quad \text{(V)}$$

where n is from 2 to 5.

For predetermined values of R, $\alpha_1$, $\alpha_2$, $Y_T$ and n, and depending on $x_t$, $\phi_1$ and $\phi_2$ can be calculated from the formulae (III) and (IV), $\beta_1$ and $\beta_2$ can be calculated from this and from the formulae (I) and (II) and finally A can be calculated from this and from formula (V) using a numerical integration. A corresponding program is given in Annex 1. The position $x_T$ of the center of the evaporator crucible and the screen positions $\phi_1(x_T)$ and $\phi_2(X_T)$ at which the efficiency of evaporation is the maximum can be determined from the curves $A(x_t)$, $\phi_1(x_t)$ and $\phi_2(X_t)$. The characteristic angular distribution of the evaporation process is usually expressed as $\cos^n(\beta)$, where $\beta$ is the evaporation angle with respect to the normal to the source and where "n" can be a value in the range of n=2 to n=5 depending on the evaporation process conditions. Normally, steady and smooth evaporation of vapor from the liquid pool surface is desired. This excludes all values of "n" greater than 5 and lower than 2. With respect to the determination of the optimum value $X_t$ the exact value of "n" is irrelevant, provided that process conditions are as desired whereas the maximum value of evaporation efficiency increases with increasing n, because in this case the angular distribution gets narrower. On the other hand, steady and smooth evaporation requires lower "n" values instead of higher ones. In other words, for the process of our invention, "n" has to be in the range of 2 to 5. Within that range, it is desirable that "n" is as high as possible. However, it has to be adjusted to the process conditions in such a way that the smooth and steady evaporation is ensured. This is well known to a person skilled in the art who therefore, indeed, runs preliminary evaporation experiments to determine the optimum value of "n" before running production (see also the paper of Feuerstein et al.) FISCHER et al., FWC of Ser. No. 08/107,053

The two Examples which follow are intended to illustrate the novel process and, for predetermined parameters R, $Y_t$, $\alpha_1$, $\alpha_2$ and n, to demonstrate the optimum positions of the evaporator crucible and of the coating screens by way of example.

EXAMPLE 1

Figure 2A:
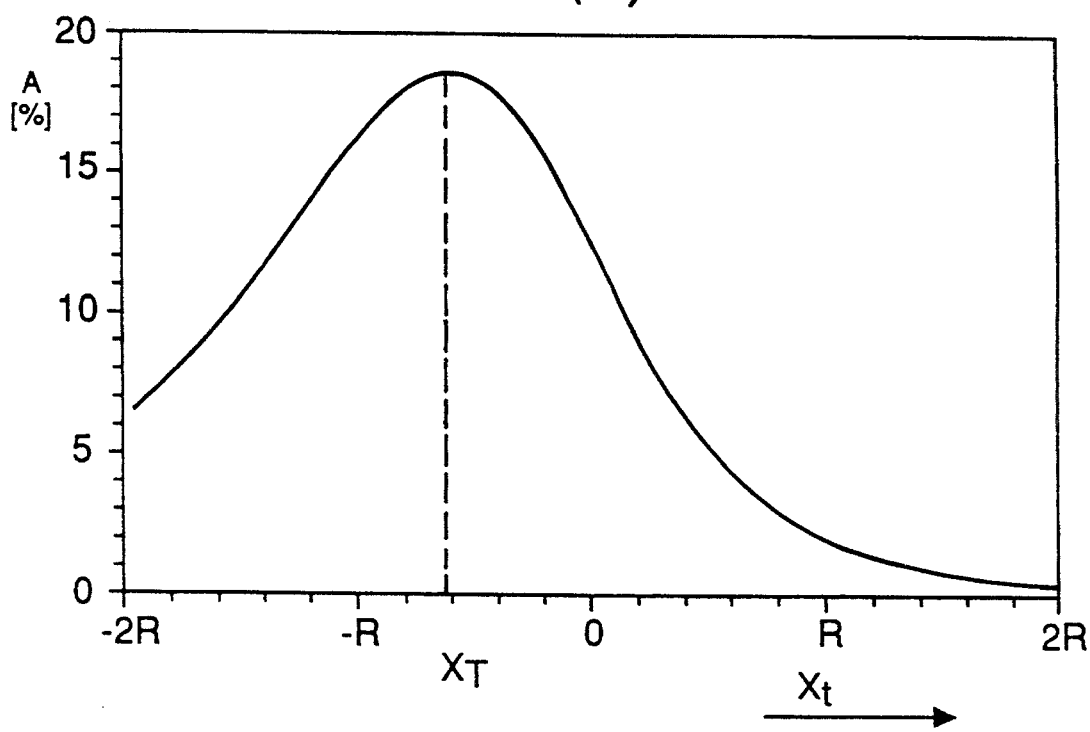
Figure 2B:
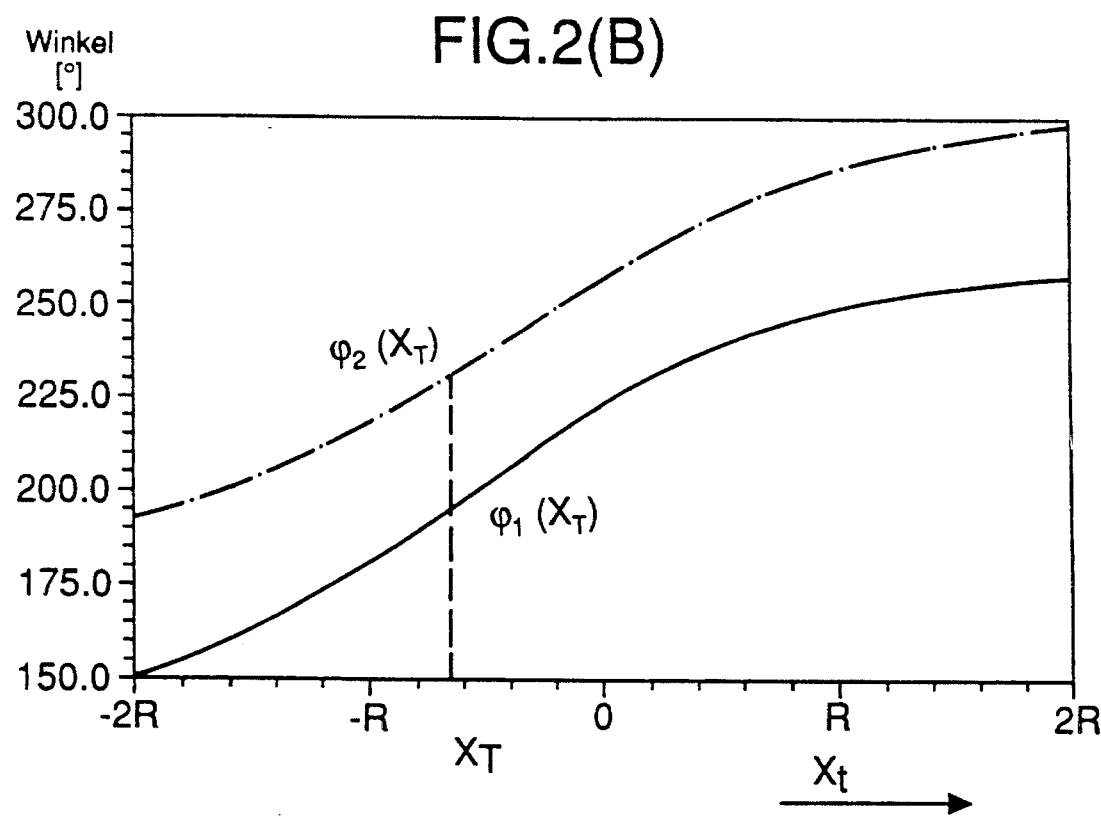
Figure 2C:
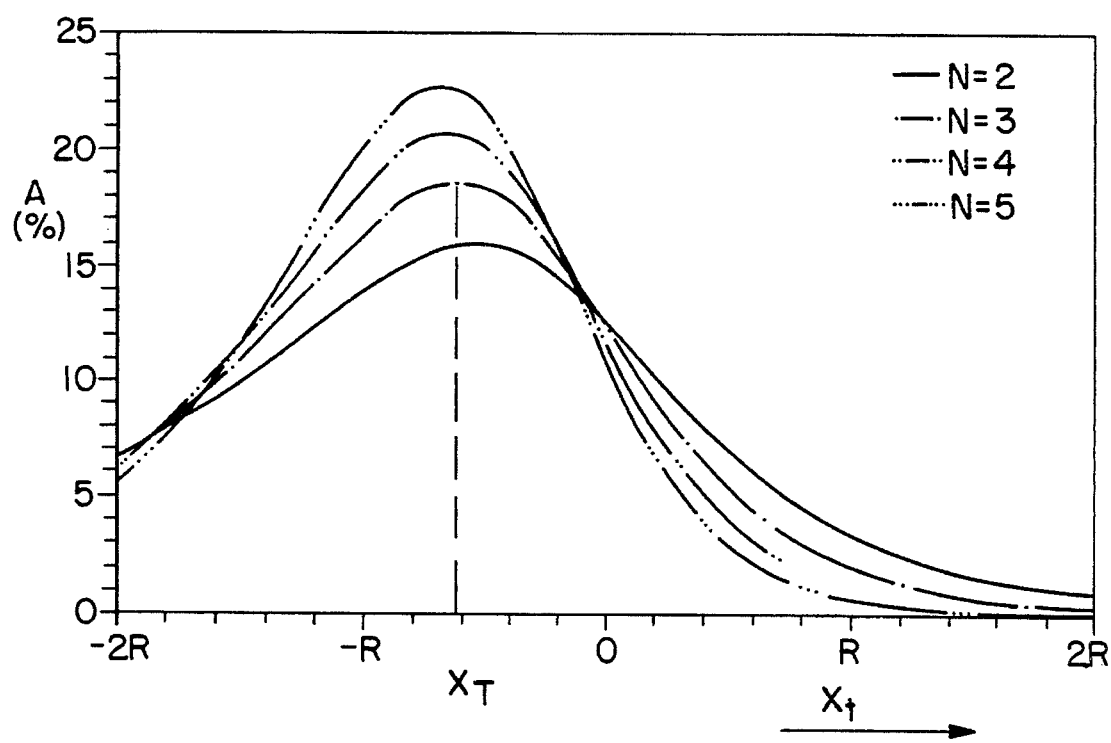

In a coating apparatus according to FIG. 1 having a support radius R, the $Y_T$ position of the crucible is defined by −1.5. R, the limiting angles of incidence $\alpha_1$ and $\alpha_2$ are defined by 90° and 40° and the exponent n is 3. Using the program listed in FIG. 4, A ($x_t$) (FIG. 2a) and $\phi_1(x_t)$ and $\phi_2(x_t)$ (FIG. 2b) were calculated. From the Figures, the crucible position $x_t$ with optimum efficiency of evaporation and the associated screen positions can be determined: $x_T$ =0.64 R, $\phi_1(x_T)$ =194°, $\phi_2(x_T)$ =230°.

EXAMPLE 2

Figure 3A:
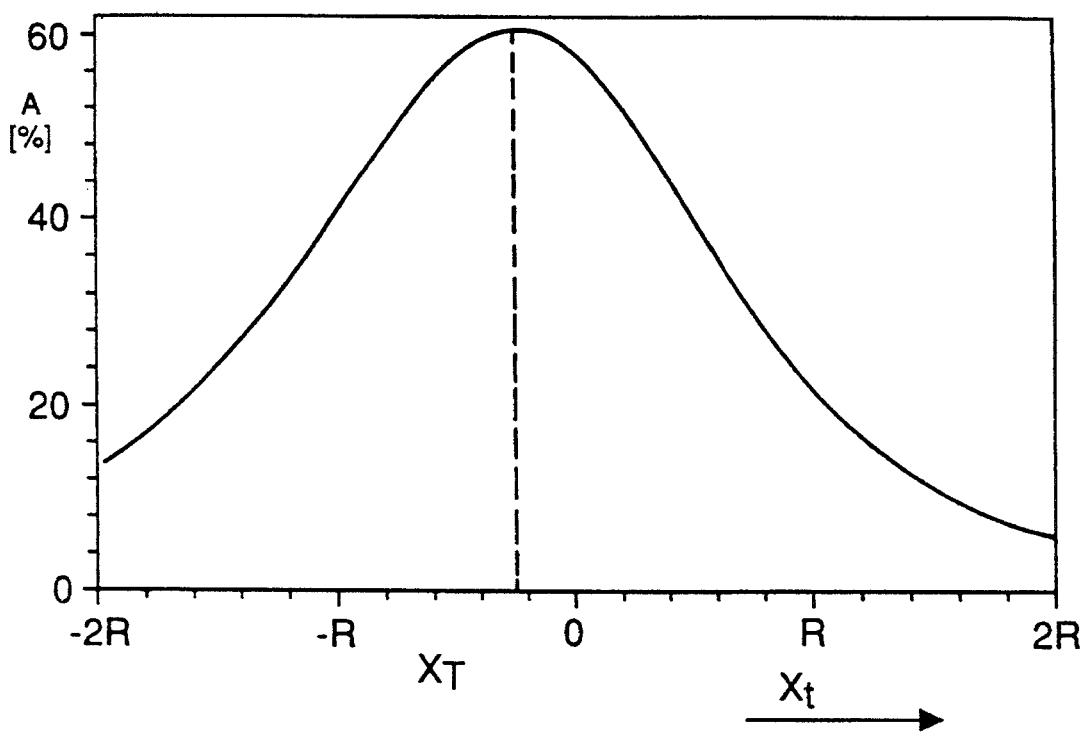
Figure 3B:
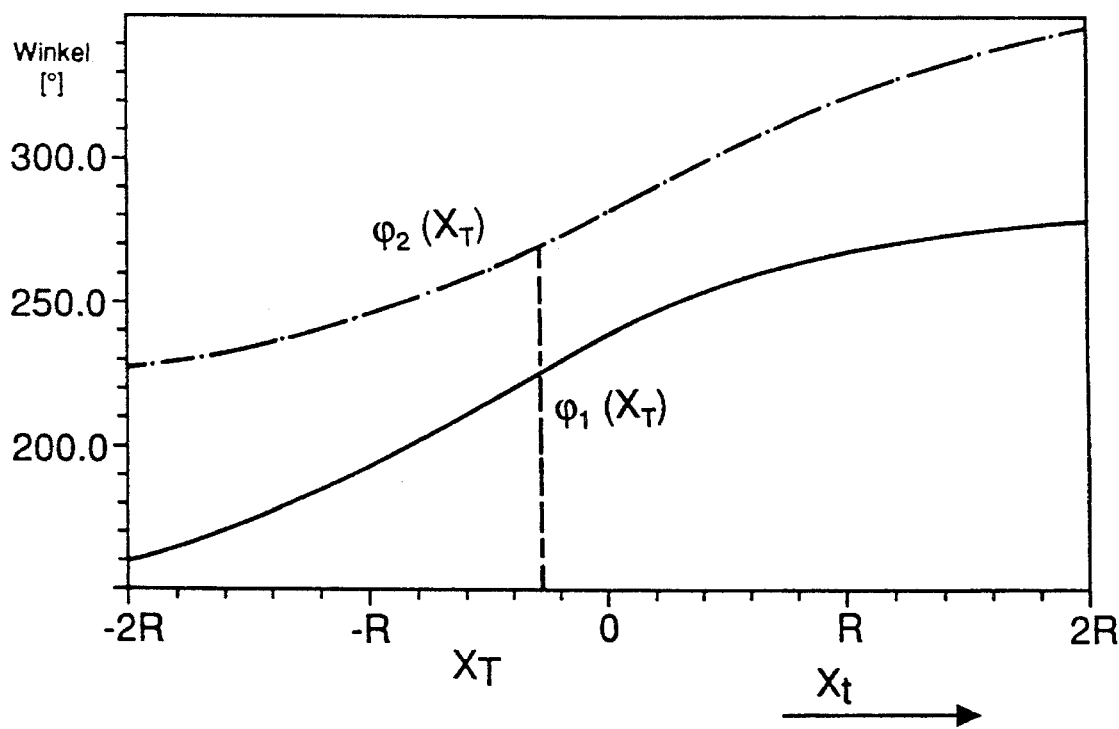
Figure 3C:
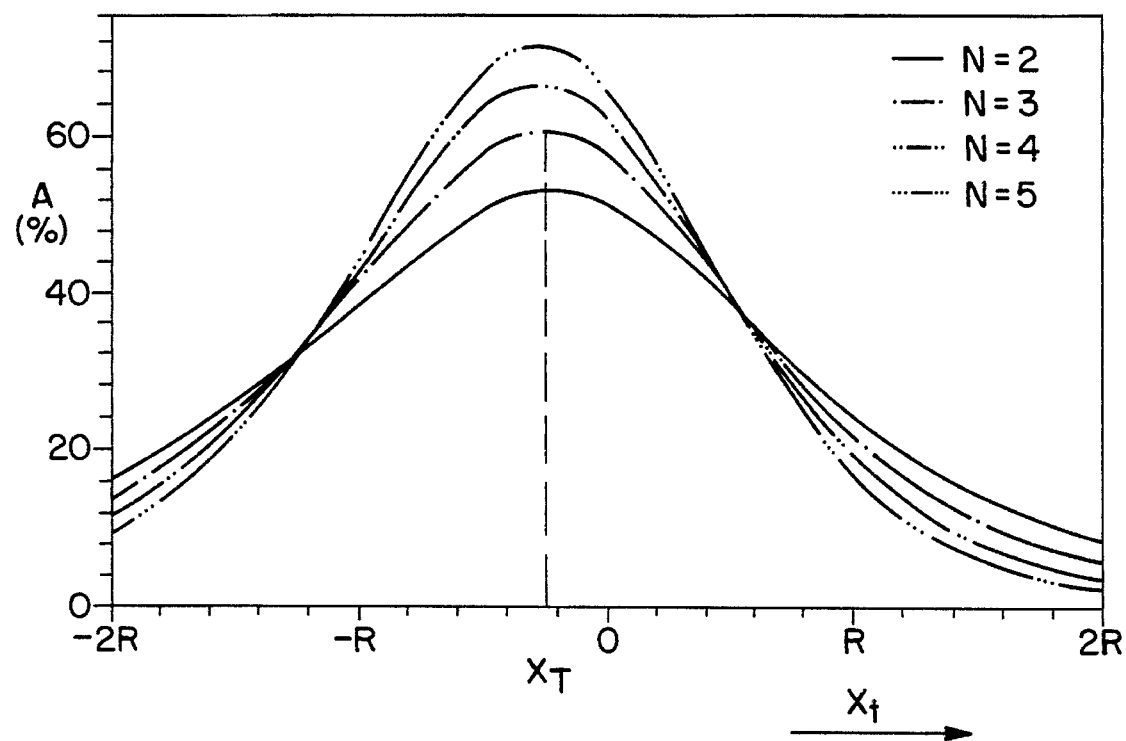

The parameters differ from those of Example 1 in that the angle $\alpha_1$ is 70° and the angle $\alpha_2$ is −20°. The corresponding calculations are shown in FIGS. 3a and 3b. The Figures have the following values for the configuration with the optimum efficiency of evaporation: $x_T$=−0.27 R, $\phi_1(x_T)$=227°, $\phi_2(x_T)$= 267°.

We claim:

1. A process for applying a thin metal layer in a thickness of less than 1,000 nm to a polymeric, web-shaped substrate which is moved along a cylindrical support in a vacuum chamber containing an evaporator crucible releasing the metal vapor toward the support and two coating screens arranged between the evaporator crucible and the support in the form of a vapor jet and defining the limiting angles of the vapor jet striking the substrate, wherein in the case of limiting angles of incidence, $\alpha_1$ and $\alpha_2$ which are given by the angles between the normals to the support at the edges of the screens and the connecting lines from the center of the crucible to the corresponding edges of the screens, the center of the evaporator crucible is arranged at the point P ($x_T/y_T$) in the co-ordinate system for a fixed $y_T$ position, and the positions of the coating screens which leave a region of the substrate limited by the angles $\phi_1$ and $\phi_2$ free for coating, the angles being calculated in the counter-clockwise direction starting from the positive x axis of a coordinate system whose origin is on the axis of rotation of the support, are defined by the angles $\alpha_1$ and $\alpha_2$ and the position of the crucible, so that, according to the formula $$A(\phi_1, \phi_2, x_t, y_T) = \int_{\beta_1(\phi_1, x_t, y_T)}^{\beta_2(\phi_2, x_t, y_T)} \cos^n(\beta) d\beta / \int_{-\frac{\pi}{2}}^{\frac{\pi}{2}} \cos^n(\beta) d\beta$$

where A has a maximum value at the point $x_t = x_T$, where $x_t$ is a free variational parameter representing the horizontal x-position of the evaporator crucible, $x_T$ is the special value of $x_t$ where the evaporation efficiency A expressed as a function of $x_T$ reaches its maximum value, $y_T$ is a fixed value representing the vertical y-position of the evaporator crucible, and where A is the relative amount of the metal vapor striking the substrate, $\beta_1$ and $\beta_2$ are the angles between the normal to the center of the crucible and the connecting lines from the center of the crucible to the edge of the screen and the exponent n, the vapor deposition characteristic of the evaporation source used, is from 2 to 5.

\* \* \* \* \*